United States Patent [19]

Goodman et al.

[11] Patent Number: 4,581,574

[45] Date of Patent: Apr. 8, 1986

[54] METHOD OF TESTING DIELECTRIC MATERIALS

[75] Inventors: Sperry H. Goodman, Kent; Gary E. Miller, Auburn; James P. Grady, Seattle, all of Wash.

[73] Assignee: The Boeing Company, Seattle, Wash.

[21] Appl. No.: 581,888

[22] Filed: Feb. 21, 1984

[51] Int. Cl.[4] .............................................. G01R 27/04
[52] U.S. Cl. ............................. 324/58 A; 324/58.5 A
[58] Field of Search .............. 324/58 A, 58.5 A, 58 B, 324/58.5 B, 58 R, 58.5 R

[56] References Cited

U.S. PATENT DOCUMENTS

| | | | |
|---|---|---|---|
| 3,046,478 | 7/1962 | Dawson | 324/58 A |
| 3,136,945 | 6/1964 | Dawson | 324/58 A |
| 3,265,967 | 8/1966 | Heald | 324/58.5 A |
| 3,525,937 | 8/1970 | Mozer | 324/72.5 |
| 4,058,766 | 11/1977 | Vogel et al. | 324/61 R |
| 4,075,555 | 2/1978 | Wight et al. | 324/58.5 R |
| 4,219,770 | 8/1980 | Weinert | 324/58 A |
| 4,220,915 | 9/1980 | Kawamoto et al. | 324/58 A |
| 4,368,421 | 1/1983 | Glander et al. | 324/58.5 A |

FOREIGN PATENT DOCUMENTS

| | | | |
|---|---|---|---|
| 1260617 | 2/1968 | Fed. Rep. of Germany | 324/58 A |
| 519651 | 7/1976 | U.S.S.R. | 324/58 A |

OTHER PUBLICATIONS

Cleveland et al, A Technique for Measuring Phase at Millimeter Wavelengths, 4-1971, pp. 406-410.
Bernshtein et al, Automatic Instrument for the Nondestructive Quality Inspection of Aluminosilicate Refractory Objects by Means of the Phase Change of Superhigh Frequency Electromagnetic Waves, 3-1974, pp. 1504-1506.
Weir; Automatic Measurement of Complex Dielectric Constant and Permeability at Microwave Frequencies; Proceedings of the IEEE, vol. 62, No. 1, pp. 33-36; Jan. 1974.
Galanina et al.; An Apparatus for Measuring the Dielectric Constant of Sheet Dielectrics in the Three-Centimeter Bank of Radio Waves; Measurement Techniques, vol. 18, No. 5, pp. 784-785 (May 1975).
Censor; Finite Series Expansion Reconstruction Methods; Proceedings of the IEEE, vol. 71, No. 3, pp. 409-419, Mar., 1983.

Primary Examiner—Reinhard J. Eisenzopf
Assistant Examiner—Jack B. Harvey
Attorney, Agent, or Firm—Christensen, O'Connor, Johnson & Kindness

[57] ABSTRACT

A method for determining the phase delay of microwave energy passing through a dielectric material, and for determining values related to the dielectric constant for microwave circuit boards. Phase delay is determined by positioning a pair of transducers adjacent different surfaces of the dielectric material, and injecting microwave energy at a certain frequency along a path through the material from the first transducer to the second transducer. The frequency of microwave radiation is that frequency at which $S_{11}$ and $S_{22}$ for the transducers are both less than a selected amount. Where the dielectric material is a conductively surfaced microwave circuit board, the path through the material is from one edge of the board to another edge through the plane of the board. Microwave circuit boards may be tested by determining values related to the dielectric constant for a plurality of such paths through the board, the paths consisting of a first group of mutually parallel paths and a second group of mutually parallel paths oriented to intersect the paths of the first group. For each path, measurements are made at the frequency or frequencies determined as described above. Iterative methods are also provided for estimating such values for areas of the microwave circuit board consisting of the intersection of one path from each group.

25 Claims, 11 Drawing Figures

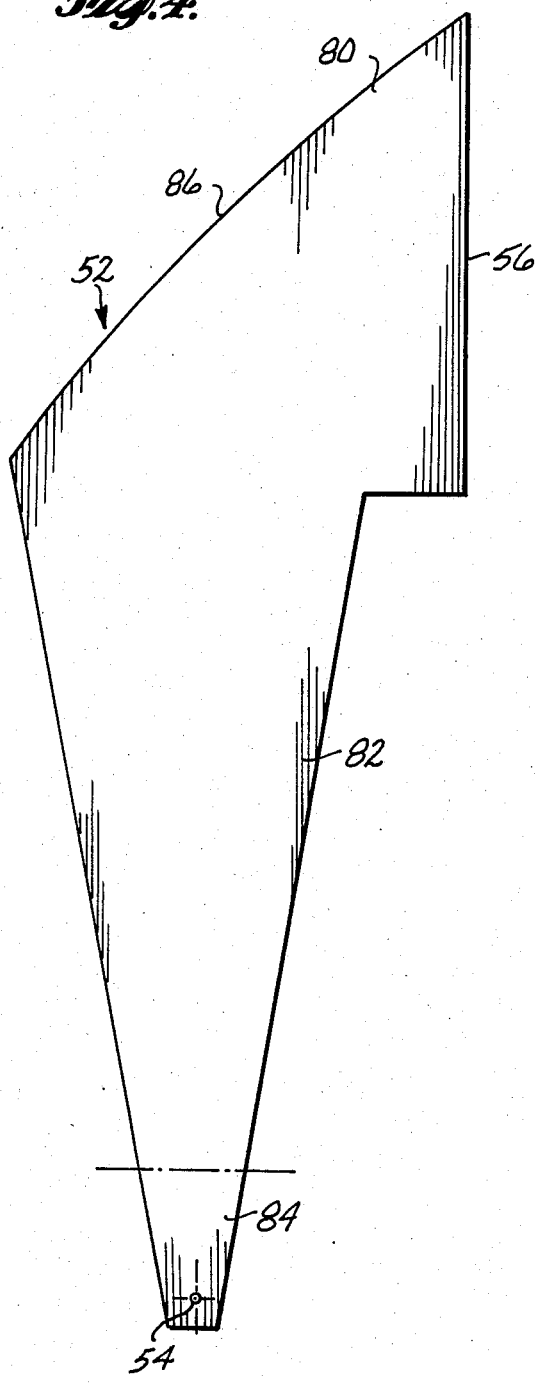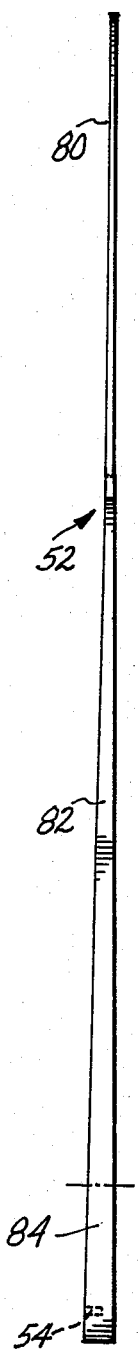

METHOD OF TESTING DIELECTRIC MATERIALS

GOVERNMENT RIGHTS

The Government has rights in this invention pursuant to Contract No. N60530-82-C-0016 awarded by the U.S. Department of the Navy.

FIELD OF THE INVENTION

The present invention relates to methods for measuring the phase delay of microwave energy passing through a dielectric material, and to methods for determining values related to the dielectric constant for microwave circuit boards.

BACKGROUND OF THE INVENTION

Microwave circuit boards consist of thin sheets of dielectric material sandwiched between two layers of copper or other metal. The thickness of the dielectric sheets is typically in the range of 0.01–0.3 inches. The boards are used for a variety of applications involving the transmission of microwave signals. The copper layers on one or both sides of the board may be etched into intricate shapes as required by a particular application.

Unlike more common low frequency circuit boards, microwave circuit boards must employ a low loss dielectric material to prevent unwanted heating and dissipation of energy. Further, and of particular importance to the present invention, the speed at which microwave energy propagates through the boards depends on the dielectric constant of the dielectric sheets. Testing and control of the dielectric constant of such sheets is, therefore, critical to reliable circuit design. The use of routine testing methods is precluded, however, by the fact that the sheets are sandwiched between copper layers that block the transmission of microwave energy.

Prior methods for testing the dielectric constant of microwave circuit boards include low frequency capacitance measurements, pull-tab methods and ultrasonic methods. Capacitance measurements simply yield boardwide averages, and provide no information concerning variations within a board. A localized anomaly in dielectric constant will therefore go undetected using a capacitance technique. In the pull-tab method, copper is removed from a small section of the board, and the underlying substrate is tested using a depole-resonant frequency technique. Unfortunately, this method destroys the board under test, and also fails to sample the entire board. Ultrasonic sounding is capable of finding local delaminations and of determining the relationship between dielectric constant and density. However, it has not yet been perfected to the point where it can reliably be used for the direct measurement of dielectric constant.

SUMMARY OF THE INVENTION

The present invention provides a method for accurately determining the phase delay of microwave energy passing through a dielectric material, and methods for determining values related to the average dielectric constant along one or more paths through a conductively surfaced sheet of dielectric material. Phase delay is measured by means of first and second microwave transducers, a microwave signal source, and means for connecting the signal source to either one of the transducers. Each transducer has an aperture through which it can radiate and receive microwave energy. The transducers are first positioned such that their apertures abut, and at least one frequency is determined at which $S_{11}$ and $S_{22}$ for the transducers are both less than a selected level, $S_{11}$ being a measure of the microwave energy reflected when the first transducer is connected to the signal source and a microwave signal is sent from the signal source to the first transducer, and $S_{22}$ being a measure of the microwave energy reflected when the second transducer is connected to the signal source and a microwave signal is sent from the signal source to the second transducer. After one or more such frequencies have been determined, the transducers are positioned adjacent different surfaces of the dielectric material and microwave energy is injected at each frequency along a path through the material from the first transducer to the second transducer.

According to another aspect of the present invention, a method is provided for determining a value related to the average dielectric constant along a path through a sheet of dielectric material having opposite faces conductively surfaced and edges of exposed dielectric. The method involves finding at least one frequency, as described above, at which both $S_{11}$ and $S_{22}$ are both less than a selected level, and then positioning the transducers adjacent different edges of the sheet and injecting microwave energy at such frequency along the path from the first transducer to the second transducer.

According to another aspect of the present invention, a method is provided for the nondestructive testing of a sheet of dielectric material having opposite faces conductively surfaced and edges of exposed dielectric. The method comprises determining values related to the average dielectric constant of the sheet along a plurality of paths in the plane of the sheet, the paths comprising a first group of mutually parallel paths and a second group of mutually parallel paths oriented to intersect the paths of the first group. For each path, the value is determined by making measurements at certain frequencies, as described above. Once such values have been determined for the various paths, they are compared with one another to identify variations in the values within the sheet.

According to a further aspect of the present invention, the values obtained for the various paths are used to estimate values related to the average dielectric constant for each area of the sheet consisting of the intersection of a path from the first group and a path from the second group. The values are estimated for such areas by first assigning an estimated value to each area. For each path in succession, the estimated values for the areas making up that path are then adjusted by an amount proportional to the difference between the average estimated values for areas making up that path and the value determined along that path. The adjustment step is continued until satisfactory estimates are obtained.

These and other features of the invention will be apparent from the drawings and description to follow, taken in conjunction with the appended claims.

BRIEF DESCRIPTION OF THE DRAWINGS

FIG. 4 is a schematic plan view of a microwave transducer for use in the method of the present invention.

FIG. 5 is a schematic side elevational view of a microwave transducer for use in the method of the present invention.

DETAILED DESCRIPTION OF THE INVENTION

Figure 1:
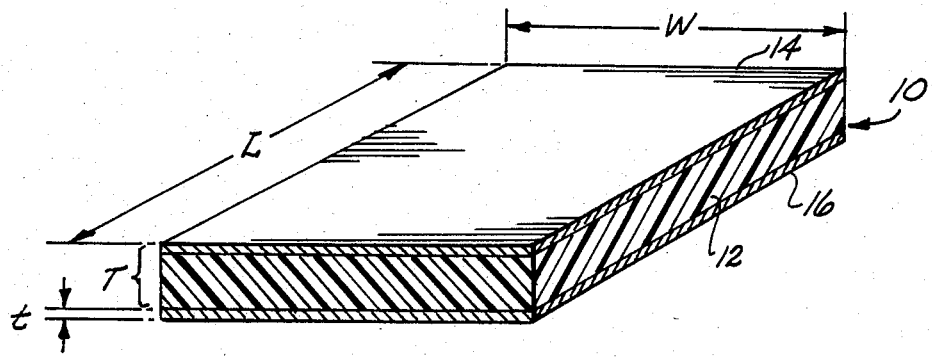
FIG. 1 is a perspective view of a microwave circuit board.

FIG. 1 illustrates a rectangular microwave circuit board 10 which may be tested by means of the present invention. Board 10 has a rectangular shape of dimensions L×W and consists of a sheet 12 of dielectric material that has been clad with thin layers 14, 16 of copper or other conducting material. The copper layers 14 and 16 completely cover the top and bottom of sheet 12, leaving the dielectric sheet exposed only along the edges of the board. Sheet 12 has thickness T that typically is in the range of 0.01–0.3 inches. The thickness T has been exaggerated in FIG. 1, and is typically smaller than dimensions L and W by an order of magnitude or more. The copper layers 14 and 16 typically have thicknesses in the range of 0.0007–0.0027 inches.

For practical mirowave applications, dielectric sheet 12 must consist of a low loss, environmentally stable substrate. A common material is fiberglass impregnated with a polytetrafluoroethylene resin, which as a dielectric constant of about 2.5. The techniques of the present invention are, however, not limited to any particular substrate.

Figure 2:
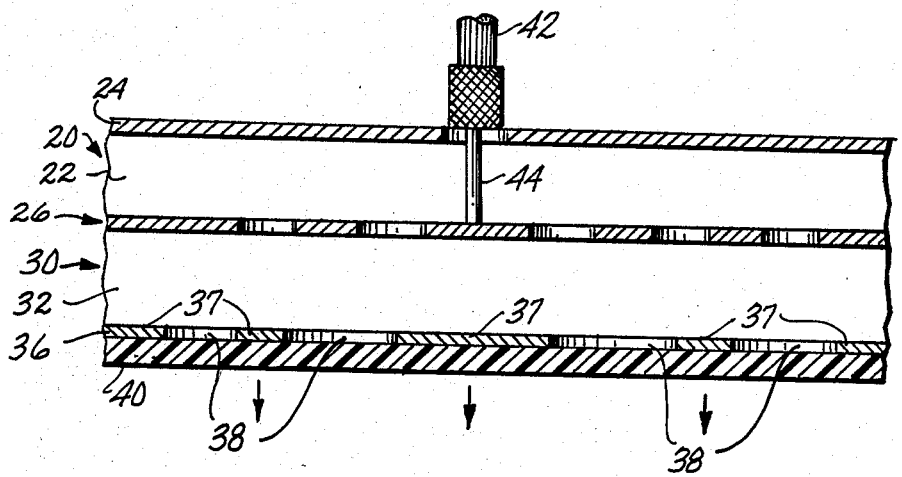
FIG. 2 is a partial cross-sectional view of an antenna constructed from two microwave circuit boards.

FIG. 2 illustrates the use of microwave circuit boards in the construction of a microwave antenna. The antenna, shown in partial cross section, consists of microwave circuit boards 20 and 30 and radome 40 stacked together in a generally parallel fashion. Radome 40 is typically an inert plastic material whose function is insulation and environmental protection. The direction of radiation from the antenna is indicated by the arrows below radome 40. Microwave energy is fed to the antenna through a coaxial cable 42 which includes a central conducting element 44. Microwave circuit board 20 consists of dielectric sheet 22 and copper layers 24 and 26, copper layer 26 having a pattern etched therein. Microwave circuit board 30 consists of dielectric sheet 32 and copper layer 36. Copper layer 36 of board 30 is etched in a manner dictated by the desired radiation pattern. The copper elements remaining in layer 36 after the etching process are indicated by numeral 37. Microwave energy injected via conducting element 44 travels through microwave circuit board 20 and a transverse electromagnetic (TEM) wave is launched in both directions parallel to the plane of the boards. The TEM wave couples to slots 38 formed in copper layer 36, and then is radiated into space. The manner in which power from conducting element 44 is divided among slots 38 is controlled by the etching patterns on copper layer 26.

An important factor in antenna design is the phase delay experienced by the TEM wave launched in layers 22 and 32. For TEM propagation, with the electric field perpendicular to the plane of the board, the phase velocity through the sheets is given by:

$$v = \frac{c}{\sqrt{e}} \quad (1)$$

where c is the velocity of light in a vacuum, and e is the dielectric constant of sheets 22 and 32. It is therefore apparent that the dielectric constant of microwave circuit boards can have a significant impact on antenna circuit design. The present invention provides an efficient method for measuring the dielectric constant and variations of the dielectric constant before the cost of etching the copper layers has been incurred. Boards that do not meet design tolerances can then be rejected or used for less critical applications.

Figure 3:
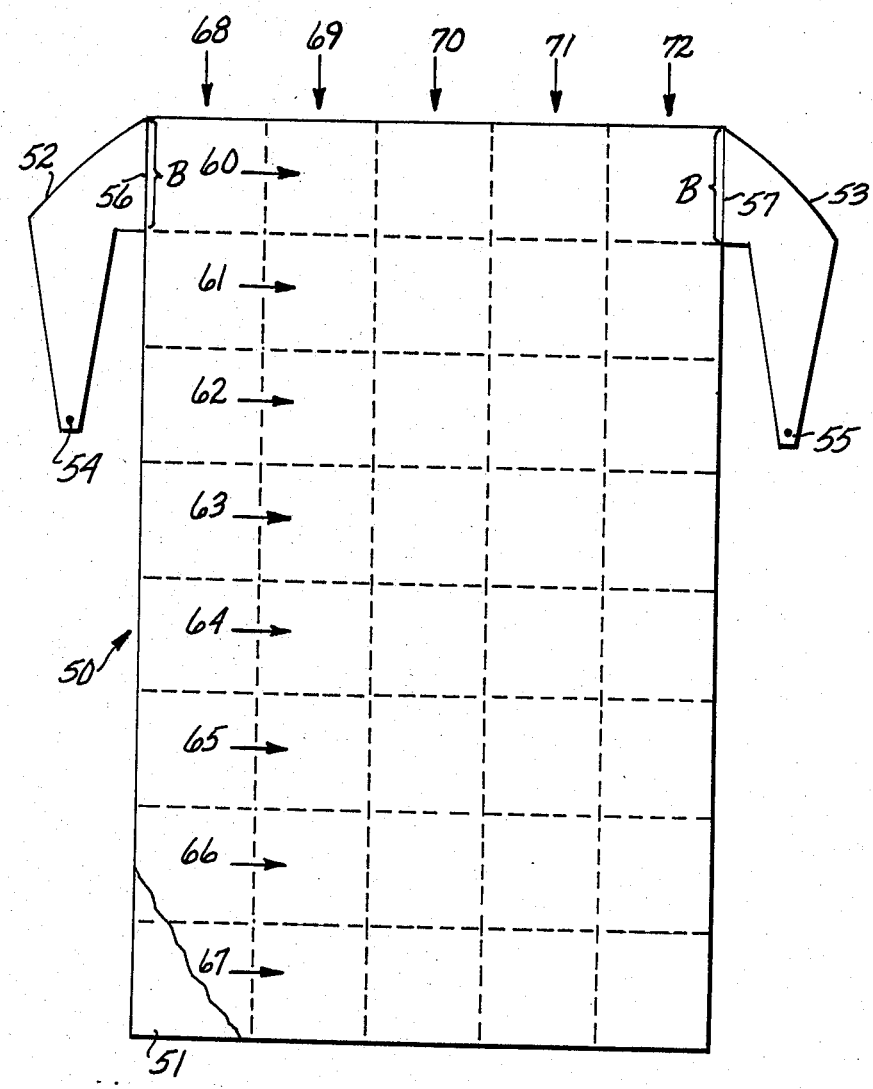
FIG. 3 is a schematic view illustrating a method for testing microwave circuit boards according to the present invention.

The measurement of phase delay along a path through a dielectric material is made in accordance with the present invention by positioning a pair of transducers adjacent different edges of the dielectric material and injecting microwave energy through the dielectric material from the first transducer to the second transducer. This method is depicted schematically in FIG. 3. In FIG. 3, microwave transducers or horns 52 and 53 have been positioned adjacent opposite edges of microwave circuit board 50. Board 50 is similar to board 10 shown in FIG. 1, and includes a dielectric sheet 51 indicated in the cutaway portion in FIG. 3. Microwave energy is injected along path 60 by transducer 52, which energy is detected by transducer 53. Transducer 52 is illustrated schematically as including a feed/pickup point 54 and aperture 56. Similarly, transducer 53 includes aperture 57 and feed/pickup point 55.

For some applications, determination of the phase delay and average dielectric constant along a single path through a dielectric material may be sufficient. In most cases, however, it will be preferable to measure phase delay or average dielectric constant along a plurality of paths through an object such as microwave circuit board 50. In such cases, a measurement can first be made along path 60, and transducers 52 and 53 and/or board 50 can then be repositioned such that path 61 is aligned between the transducers, and a similar measurement made along path 61. This process can be repeated for paths 62–67, and board 50 can then be rotated 90° with respect to the transducers, and the process continued for paths 68–72. The values measured for paths 60–72 may then be compared with one another, as described below, and the amount of variability determined. It is to be understood that the use of eight horizontal paths and five vertical paths in FIG. 3 is for illustration only, and that in general the number of paths will depend upon the precision required in a particular application. The use of a series of side by side paths of equal width will often be preferred, since if there are gaps between paths, there will be a chance of missing an area containing an anomaly. Overlapping paths may be used, but they require more effort and are generally unnecessary. If the board dimensions are not integer multiples of the aperture width B, then some small overlap will be needed to fully scan the board. Paths may vary in width, but constant width paths are more convenient since they permit scanning of an entire board with a single pair of transducers. For paths immediately adjacent the edges of the board (e.g., paths 60, 67, 68 and 72), it will at times be necessary to cover such edges with an energy absorbing material (not shown) to prevent unwanted reflections.

For a nonrectangular circuit board, adapter prisms can be used between the transducers and the board to allow injection of microwave energy in a direction different from the direction defined by the apertures of the transducers. Appropriate prisms may also be used for measurement of phase delay through microwave circuit boards having nonlinear edges, and through other dielectric materials having nonplanar surfaces.

FIGS. 4 and 5 illustrate the details of a preferred embodiment of transducer 52, transducer 53 preferably being identical to transducer 52 in construction. As indicated, transducer 52 comprises a thin, upper portion 80 that includes aperture 56, tapered central portion 82, and a comparatively thick lower portion 84 that includes feed/pickup point 54. The entire transducer, with the exception of aperture 56 and point 54, is covered with a conductive material. The thickness of upper portion 80, and therefore of aperture 56, is selected to match the thickness of the dielectric sheet of a microwave circuit board to be tested.

Upper portion 80 of transducer 52 includes edge 86, edge 86 having the shape of an arc of a parabola that has its focus at point 54 and that opens in the direction of aperture 56, i.e., to the right in FIG. 4. As is known to those skilled in the art, the result will be that radiation introduced at point 54 will be reflected from parabolic edge 86 and will emerge from aperture 56 with a comparatively flat phase front. In a similar manner, radiation entering aperture 56 with a flat phase front will be coherently focused by edge 86 onto point 54. Although preferred, parabolic transducers are not generally required for carrying out the present invention, and other transducers such as tapered sectoral horns are sufficient for many applications.

Referring again to FIG. 3, transducer 52 is positioned such that it is capable of injecting a beam of microwave energy edgewise into dielectric sheet 51 of board 50 along path 60, with an effective aperture or beam width B. Transducer 53 is positioned in alignment with transducer 52, such that it is capable of receiving microwave energy traveling along path 60 with an effective aperture also equal to B. The distance at which the divergence of radiation from aperture 56 begins to become significant is given by:

$$D = \frac{B^2 \sqrt{e}}{\lambda} \quad (2)$$

where B is the width of aperture 56, $\lambda$ is the wavelength of the radiation in a vacuum, and e is the dielectric constant of sheet 51. Negligible beam divergence can be achieved by proper selection of these parameters. Thus, for a board 18 inches wide having a dielectric constant of about 2.5, one might choose B=3 inches, $\lambda = \frac{2}{3}$ inches (18 GHz), giving a value for D of about 21 inches. The wavelength of the radiation is also selected so that the principal mode of propagation is TEM. Under such circumstances, equation 1 holds, and there is a known relationship between dielectric constant and wave velocity. To assure that the TEM mode predominates, the wavelength in the dielectric material should be greater than the thickness of sheet 51 and preferably greater than twice such thickness.

It has been found that the phase delay of microwave radiation passing through a dielectric material can be measured very accurately by a method which takes into account the characteristics of particular horns or transducers used to make the measurements. The method comprises the four steps illustrated by FIGS. 6, 7, 9 and 10. In the first step (FIG. 6), first and second tranducers 108 and 110 are positioned with their apertures abutting, the second transducer is connected to a terminating load, and the reflection coefficient $S_{11}$ at the first transducer is measured over a range of frequencies. In the second step (FIG. 7), the cables to the transducers are reversed, and the reflection coefficient $S_{22}$ is measured over the same frequency range. The $S_{11}$ and $S_{22}$ values are then used to select one or more measurement frequencies, as described below (FIG. 8), and the third and fourth steps are then performed at each measurement frequency. In the third step (FIG. 9), a reference phase delay is determined through transducers 108 and 110 at each measurement frequency. In the fourth step (FIG. 10), a dielectric material such as microwave circuit board 140 is placed between the transducers, and the phase delay through the transducers and the board is measured at each measurement frequency. By subtracting the reference phase delay from the phase delay measured with board 140 in place, the phase delay through the dielectric material of the board may be accurately determined.

Figure 6:
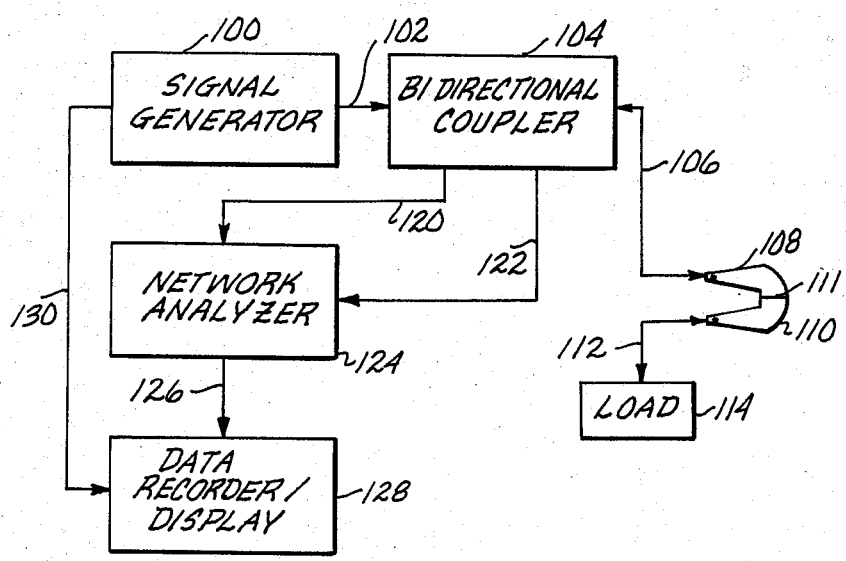
FIG. 6 is a block diagram illustrating the measurement of $S_{11}$ according to the method of the present invention.

Referring now to FIG. 6, an apparatus is shown for determining $S_{11}$, the reflection at port 1, for a pair of transducers or horns 108 and 110. A signal generator 100 is provided for generating single frequency microwave signals on cable 102. The signal on cable 102 passes through bidirectional coupler 104 to cable 106, and from there to microwave transducer 108. Transducer 108 is positioned such that its aperture abuts the aperture of microwave transducer 110, which in turn is connected through cable 112 to terminating load 114. Transducers 108 and 110 are preferably constructed such that their apertures match in size and shape, permitting a tight seal to be formed along junction 111 between the apertures. Junction 111 may also be covered with copper tape or equivalent material to improve the seal at the junction. Bidirectional coupler 104 passes the major portion of the signal on cable 102 through to cable 106, and also extracts a sample of signal 102 and passes it to network analyzer 124 through cable 120.

Figure 8:
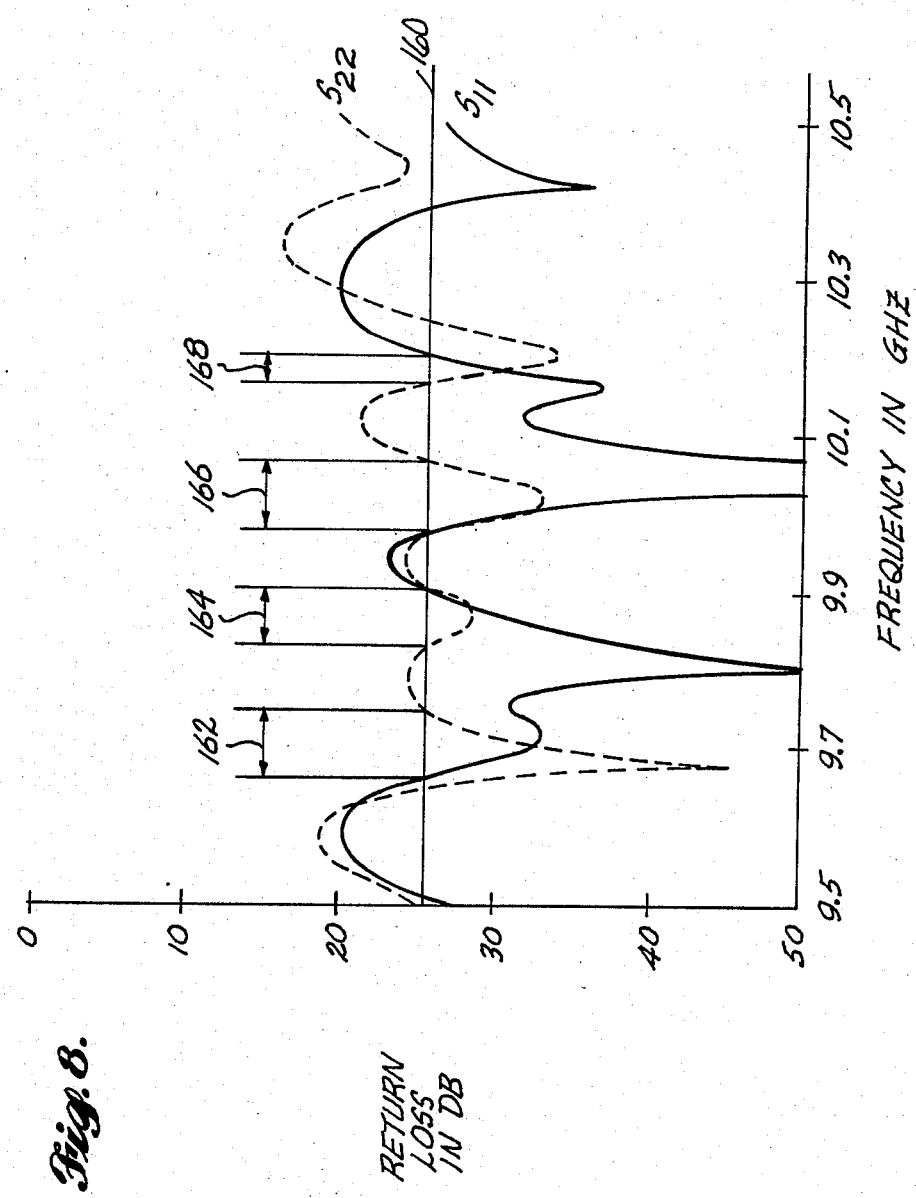
FIG. 8 is a graph illustrating variations of $S_{11}$ and $S_{22}$ over a range of frequencies.

The impedance of load 114 is chosen to match that of cable 112, thereby eliminating or minimizing reflections of the signal at the interface between cable 112 and load 114. Any reflections caused by other components in the system, and particularly by transducers 108 and 110, are passed back through cable 106 to bidirectional coupler 104. The bidirectional coupler samples the reflected signal, and sends a sample of the reflected signal to network analyzer 124 through cable 122. The network analyzer compares the transmitted sample on cable 120 with reflected sample on cable 122, and provides an output signal on line 126 proportional to the difference between these two signals. Data recorder/display unit 128 receives the signal on line 126, as well as a signal on line 130 representing the frequency of the signal produced by signal generator 100, and records or displays the variations in the difference signal as the frequency of the signal produced by signal generator 100 is varied. The solid curve ($S_{11}$) in FIG. 8 represents a typical result of such a measurement over a range of frequencies in the vicinity of 10 GHz. The ordinate in FIG. 8 is the return loss in decibels, a return loss of zero corresponding to total reflection by transducers 108 and 110 (signals on lines 120 and 122 equal in magnitude). Decreasing ordinate values in FIG. 8 (higher values of return loss) correspond to logarithmically decreasing levels of reflection.

Figure 7:
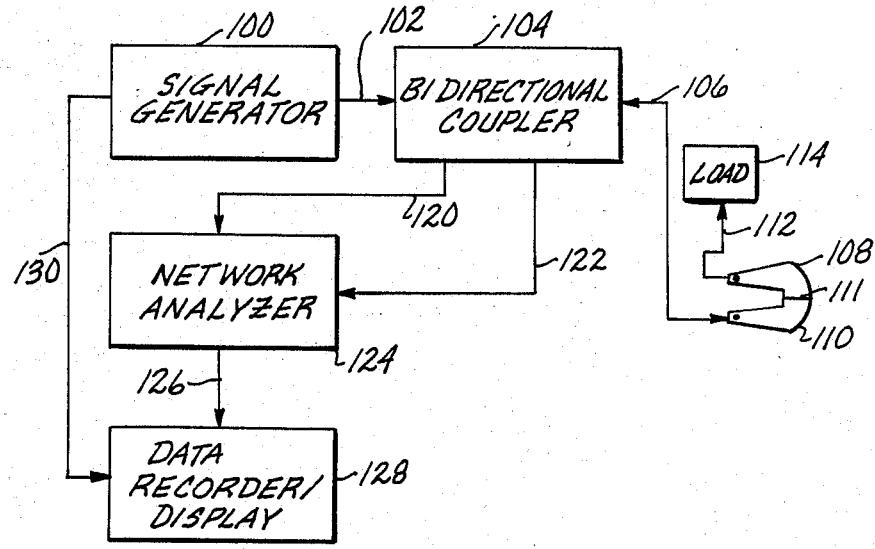
FIG. 7 is a block diagram illustrating the measurement of $S_{22}$ according to the method of the present invention.

The second step in the determination of phase delay according to the present invention involves the determination of $S_{22}$ for transducers 108 and 110. Referring to FIG. 7, this determination is made using an apparatus similar to the apparatus of FIG. 6, except that cables 106 and 112 are reversed so that the signal from signal generator 100 is passed through bi-directional coupler 104 into transducer 110, and transducer 108 is connected to terminating load 114. By such means, $S_{22}$ is determined over a range of frequencies similar to the range determined for $S_{11}$. A typical result for $S_{22}$ is indicated by the dashed curve in FIG. 8.

In accordance with the present invention, extremely accurate phase delay measurements may be made using transducers 108 and 110 by making such measurements at one or more frequencies at which both $S_{11}$ and $S_{22}$ for the transducers are less than a selected level. The exact level used will, of course, depend upon the application. For measuring phase delay through typical microwave circuit boards, a level of 25 db has been found suitable. This level is indicated by line 160 in FIG. 8. In the example shown in this figure, there are four frequency ranges within which both $S_{11}$ and $S_{22}$ are less than level of line 160. These frequency ranges are indicated by numerals 162, 164, 166 and 168. In accordance with the present invention, one or more measurement frequency from these ranges are selected and used for carrying out the phase delay measurements described below.

Figure 9:
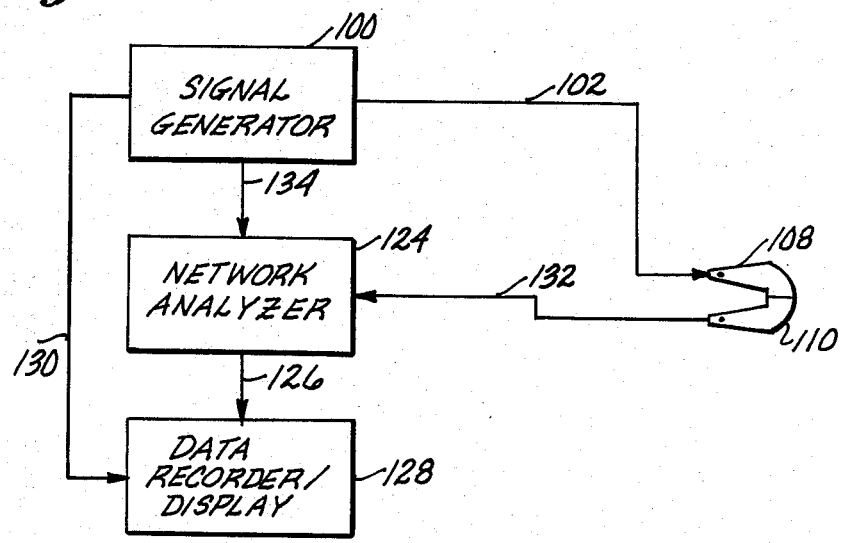
FIG. 9 is a block diagram illustrating the measurement of a reference phase delay.
Figure 10:
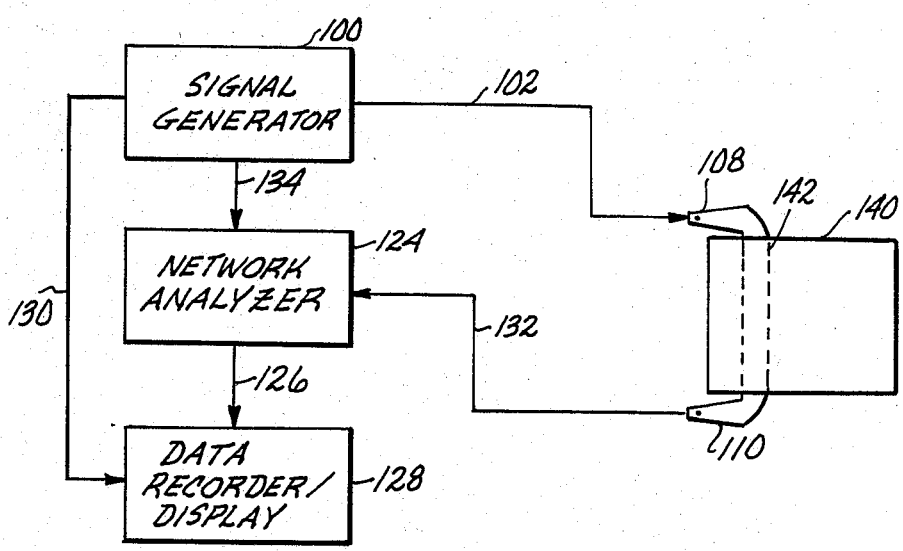
FIG. 10 is a block diagram illustrating the measurement of phase delay through a microwave circuit board.

At each measurement frequency, the third and fourth steps illustrated by FIGS. 9 and 10, respectively, are performed. In FIG. 9, transducers 108 and 110 are positioned, as above, with their apertures abutting. Signal generator 100 is adjusted to produce an output signal at one of the measurement frequencies, and that output signal is sent through cable 102 directly to transducer 108. The signal passing through the transducers is sent from transducer 110 directly to network analyzer 124 through cable 132. The network analyzer, now operating in a phase comparison mode, provides an output signal on line 126 proportional to the phase difference between the signal on cable 132 and a phase reference signal received directly from signal generator 100 through cable 134. The signal on line 126 thus corresponds to the difference, at the measurement frequency, between the phase delay experienced by the signal passing through cable 134 and the phase delay experienced by the signal passing through cable 102, transducer 108, transducer 110, and cable 132. This phase difference is then used as a reference for subsequent phase delay measurements at tha measurement frequency.

The fourth step in the phase delay measurement process is illustrated in FIG. 10. This figure is identical to FIG. 9, except that microwave circuit board 140 has been positioned between transducers 108 and 110, in a manner similar to that shown in FIG. 3. With board 140 in the position indicated, the phase delay is measured at each of the measurement frequencies, and the respective reference values obtained above (FIG. 9) are subtracted from such measurements to yield values for the actual phase delay along path 142 through microwave circuit board 140 at each measurement frequency. After measurements have been made at all measurement frequencies for a given path 142, microwave circuit board 140 and/or transducers 108, 110 may be repositioned to repeat the mesurements for another path through the circuit board. By repeating the sequence, an entire board may be scanned by two intersecting groups of paths, as indicated in FIG. 3.

For each path 142, the mean dielectric constant along such path is related to the phase delay by:

$$\phi_a = \frac{2\pi f}{c} \sqrt{e_{av}}\, L \qquad (3)$$

where $\phi_a$ is the actual phase delay along path 142, f is the measurement frequency, L is the length of path 142, c is the velocity of light in a vacuum, and $e_{av}$ is the average dielectric constant along path 142. For the common situation in which path length L is greater than the wavelength of the radiation, the actual phase delay $\phi_a$ is related to the measured phase delay $\phi_m$ as follows:

$$\phi_a = n2\pi + \phi_m \qquad (4)$$

where n is a positive integer. In general n is unknown, and thus there is an ambiguity in the determination of $\phi_a$. As those skilled in this art are aware, there are a number of techniques available for removing this ambiguity. For example, if an approximate value for the average dielectric constant along path 142 is known, then that approximate value, together with the known value for path length L, can be used in equation (3) to obtain approximate value for $\phi_a$. The approximate value for $\phi_a$ can then be used in equation (4) to determine n. In this method, determination of $\phi_m$ at a single measurement frequency is sufficient.

Generally, a more accurate determination of average dielectric constant can be made when $\phi_m$ has been determined at a plurality of measurement frequencies. One technique makes use of the fact that $\phi_a$ and f are linearly related, and in particular that:

$$\frac{\Delta \phi a}{\Delta f} = \frac{2\pi}{c} \sqrt{e_{av}}\, L \qquad (5)$$

where the left-hand side of equation (5) corresponds to the slope of the line through the data points when phase delay is plotted as a function of frequency. By estimating a value for $e_{av}$, an estimated slope for such a line may be determined. The measurement points are then adjusted along the frequency axis, in increments of $2\pi$, until the points fall approximately on a straight line having that estimated slope. A second line is then drawn through the points, using a least squares technique. The slope of the second line is then used, together with equation (5), to determine an accurate value for $e_{av}$ for the path.

When the average dielectric constant or other parameter has been determined for a plurality of intersecting paths through a microwave circuit board, the average values can be compared with one another in order to identify variations throughout the board. When the average dielectric constant has been determined along a comparatively large number of intersecting paths, it can become difficult to determine the significance of variations in the average merely by inspection. For such cases, automated or computerized methods for estimating dielectric constant values throughout the board are preferred.

Figure 11:
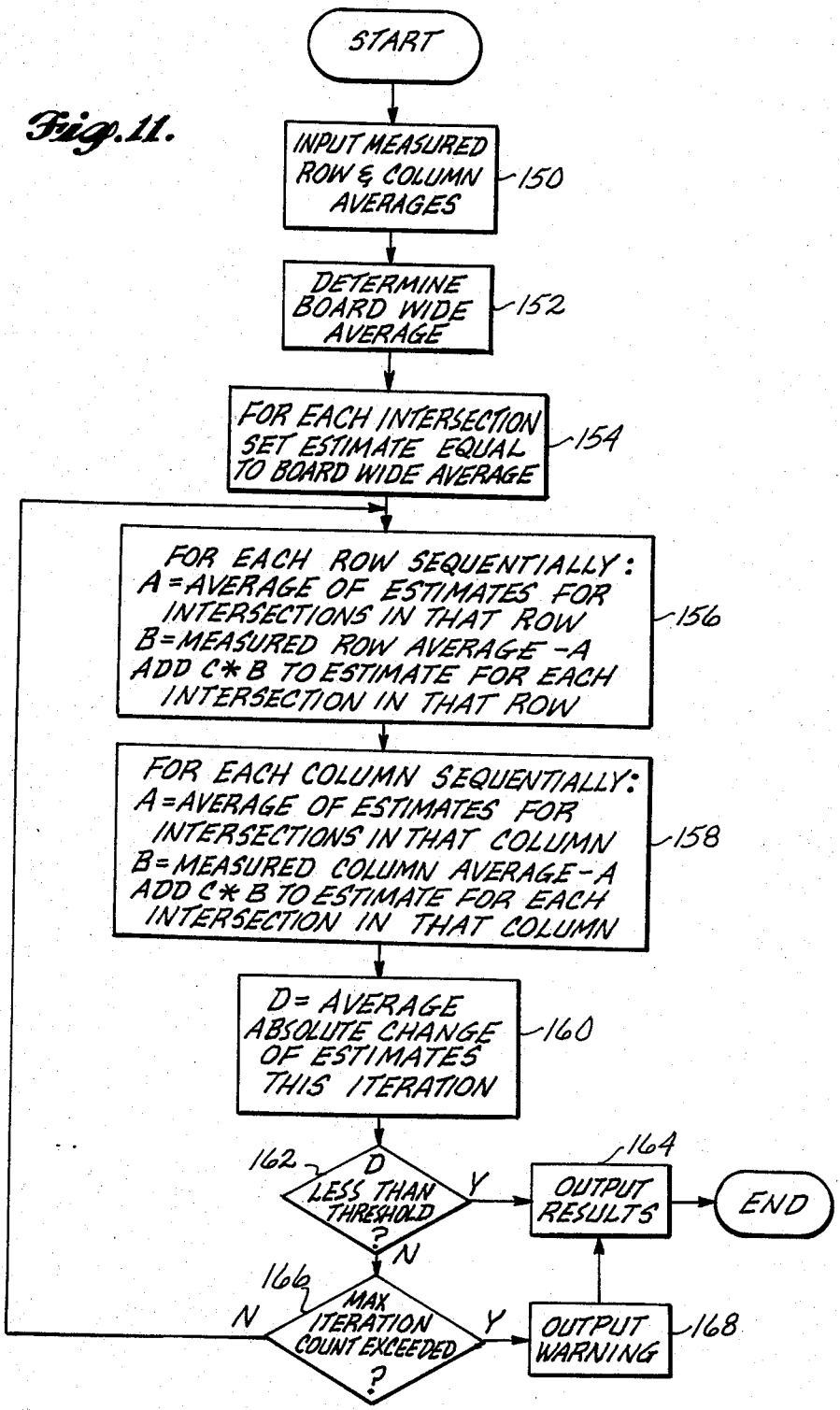
FIG. 11 is a flowchart of a program for estimating dielectric constant for individual areas of a microwave circuit board.

Referring to FIG. 3, one such method is based upon analyzing the average values for the rows (paths 60-67) and columns (paths 68-72) to produce estimates of the average value for each area defined by the intersection of one row and one column. FIG. 11 sets forth the flow chart of a program for carrying out such an analysis using any general purpose digital computer. The program begins by inputting the measured average dielectric constant values for the rows and columns in block 150. Block 152 then averages the row and column averages to produce a boardwide average for the dielectric constant, and block 154 sets the estimate for each intersection equal to the boardwide average. The program then enters an iteration loop commencing with block 156. Block 156 sequentially processes each row by adjusting the estimates for the intersections making up that row based upon the measured average for that row. In particular, for each row sequentially, block 156 first finds the average of the current estimates for the intersections in the row, then determines the difference between the measured row average and the average of the current estimates, and then adds that difference, multiplied by a convergence or damping factor C, to the estimate for each intersection in the row. The value of C may be adjusted to strike a reasonable balance between speed of convergence and avoidance of oscillation. In most instances, values of C between 0.5 and 1.0 are suitable.

After the estimates have been processed in a row by row fashion in block 156, block 158 performs a similar adjustment on a column-by-column basis. In particular, block 158, for each column, finds the average of the current estimates for the intersections in that column, then finds the difference between the measured column average and the average of the current estimates, and then adds that difference multiplied by convergence factor C to the estimate for each intersection in the column.

Block 160 determines the average absolute change in the estimates for the current iteration, i.e., for the most recent execution of blocks 156 and 158. If the total absolute difference (D) between the current and preceding estimates is less than a predetermined threshold, then the analysis is complete, and block 162 passes control to block 164 where the results are output and the program ends. The threshold is selected such that values of D that satisfy the test in block 162 correspond to insignificant changes in the estimates, e.g., to relative changes in the estimates of less than 1%. If the difference D is not less than the threshold, then control passes to block 166 where the iteration count is checked. If the iteration count has not exceeded a predetermined maximum, then control returns to block 156 and another iteration is commenced. If the maximum iteration count is exceeded, then block 166 passes control to block 168. Block 168 outputs a warning message, after which block 164 outputs the current estimates, and the program ends. A maximum iteration count of 10 will suffice for most applications.

While the preferred embodiments of the invention have been illustrated and described herein, it should be understood that variations will be apparent to those skilled in the art. Accordingly, the invention is not to be limited to the specific embodiments illustrated and described herein, and the true scope and spirit of the invention are to be determined by reference to the appended claims.

The embodiments of the invention in which an exclusive property or privilege is claimed are defined as follows:

1. A method of accurately measuring the phase delay of microwave energy passing along a path through a dielectric material by selection of the frequency of the microwave energy, the method comprising:
   providing first and second microwave transducers, a microwave signal source, and means for connecting the signal source to either one of the transducers, each of the transducers having an aperture through which it can radiate and receive microwave energy, each aperture being adapted for positioning adjacent the dielectric material;
   determining a frequency at which $S_{11}$ and $S_{22}$ for the transducers are both less than a selected level, $S_{11}$ being a measure of the amount of microwave energy reflected when the transducers are positioned with their apertures abutting, the first transducer is connected to the signal source, and a microwave signal is sent from the signal source to the first transducer, and $S_{22}$ being a measure of the amount of microwave energy reflected when the transducers are positioned with their apertures abutting, the second transducer is connected to the signal source, and a microwave signal is sent from the signal source to the second transducer;
   positioning the tranducers adjacent different surfaces of the dielectric material and injecting microwave energy at said frequency along said path from the first transducer to the second transducer; and
   determining the phase delay of the microwave energy at said frequency along said path.

2. The method of claim 1, wherein determining the phase delay comprises measuring a reference phase delay at said frequency through the transducers positioned with their apertures abutting, measuring a total phase delay at said frequency through the transducers and along said path, and subtracting the reference phase delay from the total phase delay.

3. The method of claim 1, wherein determining a frequency at which $S_{11}$ and $S_{22}$ for the transducers are both less than a selected level comprises measuring $S_{11}$ and $S_{22}$ at a plurality of frequencies.

4. The method of claim 3, wherein measuring $S_{11}$ and $S_{22}$ comprises connecting the second transducer to a terminating load when $S_{11}$ is measured, and connecting the first transducer to a terminating load when $S_{22}$ is measured.

5. The method of claim 1, wherein the dielectric material comprises a sheet of dielectric material having opposite faces conductively surfaced and essentially linear edges of exposed dielectric, and wherein the apertures of the transducers are essentially linear and have a thickness approximately equal to the thickness of said sheet.

6. A method of accurately measuring a value related to the average dielectric constant along a path through a sheet of dielectric material having opposite faces conductively surfaced and edges of exposed dielectric by means of microwave energy having a preselected frequency, comprising:

providing first and second microwave transducers, a microwave signal source, and means for connecting the signal source to either one of the transducers, each of the transducers having an aperture through which it can radiate and receive microwave energy, each aperture being adapted for positioning adjacent an edge of the sheet;

determining a frequency at which $S_{11}$ and $S_{22}$ for the transducers are both less than a selected level, $S_{11}$ being a measure of the amount of microwave energy reflected when the transducers are positioned with their apertures abutting, the first transducer is connected to the signal source, and a microwave signal is sent from the signal to the first transducer, and $S_{22}$ being a measure of the amount of microwave energy reflected when the transducers are positioned with their apertures abutting, the second transducer is connected to the signal source, and a microwave signal is sent from the signal source to the second transducer;

positioning the transducers adjacent different edges of the sheet and injecting microwave energy at said frequency along said path from the first transducer to the second transducer, and, determining the phase delay of the microwave energy at said frequency along said path.

7. The method of claim 6, wherein determining said value comprises measuring a reference phase delay at said frequency through the transducers positioned with their apertures abutting, measuring a total phase delay at said frequency through the tranducers and along said path, and subtracting the reference phase delay from the total phase delay.

8. The method of claim 6, wherein determining a frequency at which $S_{11}$ and $S_{22}$ for the transducers are both less than a selected level comprises measuring $S_{11}$ and $S_{22}$ at a plurality of frequencies.

9. The method of claim 8, wherein measuring $S_{11}$ and $S_{22}$ comprises connecting the second transducer to a terminating load when $S_{11}$ is measured, and connecting the first transducer to a terminating load when $S_{22}$ is measured.

10. The method of claim 6, wherein the edges of the sheet are essentially linear and wherein the apertures of the transducers are essentially linear and have a thickness approximately equal to the thickness of the sheet.

11. The method of claim 6, wherein a plurality of frequencies are determined at which $S_{11}$ and $S_{22}$ for the transducers are both less than a selected level, and wherein determining said value comprises injecting microwave energy along said path at each of said frequencies.

12. The method claim 11, wherein determining said value comprises determining the apparent average phase delay of microwave energy along said path at each of said frequencies, and determining the average dielectric constant along said path based upon the apparent average phase delays.

13. The method of claim 12, wherein determining the average dielectric constant comprises determining the relationship between phase delay and frequency using a least squares technique.

14. A method for the nondestructive testing of a sheet of dielectric material having opposite faces conductively surfaced and edges of exposed dielectric by measuring the phase delay of microwave energy of a selected frequency along paths through the dielectric material, the method comprising:

(a) determining, by means of injected microwave energy passed through the dielectric sheet, respective values related to the average dielectric constant of the sheet along a plurality of paths in the plane of the sheet, said paths comprising a first group of mutually parallel paths and a second group of mutually parallel paths oriented to intersect the paths of the first group, the step of determining said respective values comprising:

(i) providing first and second microwave transducers, a microwave signal source, and means for connecting the signal source to either one of the transducers, each of the transducers having an aperture through which it can radiate and receive microwave energy, each aperture being adapted for positioning adjacent an edge of the sheet;

(ii) determining a frequency at which $S_{11}$ and $S_{22}$ for the transducers are both less than a selected level, $S_{11}$ being a measure of the amount of microwave energy reflected when the transducers are positioned with their apertures abutting, the first transducer is connectd to the signal source, and a microwave signal is sent from the signal source to the first transducer, and $S_{22}$ being a measure of the amount of mircrowave energy reflected when the transducers are positioned with their apertures abutting, the second transducer is connected to the signal source, and a microwave signal is sent from the signal source to the second transducer; and (iii) successively positioning the transducers adjacent edges of the sheet such that microwave energy can be injected along said paths from the first transducer to the second transducer, and injecting microwave energy at said frequency along each path from the first transducer to the second transducer; and (b) comparing said values with one another, thereby identifying variations in said values within the sheet.

15. The method of claim 14, wherein determining said respective values further comprises measuring a reference phase delay at said frequency through the transducers positioned with their apertures abutting, measuring a total phase delay at said frequency through the transducers and along each of said paths, and for each path subtracting the reference phase delay from the total phase delay.

16. The method of claim 14, wherein determining a frequency at which $S_{11}$ and $S_{22}$ for the transducers are both less than a selected level comprises measuring $S_{11}$ and $S_{22}$ at a plurality of frequencies.

17. The method of claim 16, wherein measuring $S_{11}$ and $S_{22}$ comprises connecting the second transducer to a terminating load when $S_{11}$ is measured, and connecting the first transducer to a terminating load when $S_{22}$ is measured.

18. The method of claim 14, wherein the edges of the sheet are essentially linear and wherein the apertures of the transducers are essentially linear and have a thickness approximately equal to the thickness of the sheet.

19. The method of claim 14, wherein a plurality of frequencies are determined at which $S_{11}$ and $S_{22}$ for the transducers are both less than a selected level, and wherein determining said respective values comprises injecting microwave energy along each path at each of said frequencies.

20. The method of claim 19, wherein determining said respective values comprises determining, for each path, the apparent average phase delay of microwave energy along the path at each of said frequencies, and determining the average dielectric constant along the path based upon the apparent average phase delays.

21. The method of claim 20, wherein determining the average dielectric constant for each path comprises determining the relationship between phase delay and frequency using a least squares technique.

22. The method of claim 14, wherein comparing said values comprises estimating, for each area of the sheet consisting of the intersection of a path selected from the first group and a path selected from the second group, a value related to the mean dielectric constant for said area.

23. The method of claim 22, wherein estimating a value related to the mean dielectric constant for each of said areas comprises:
(a) assigning an estimated value to each area;
(b) for each path in succession, adjusting the estimated values for the areas making up that path by an amount proportional to the difference between the average estimated value for areas making up that path and the value determined along that path; and
(c) repeating step (b) one or more times until the amounts of the adjustments become insignificant in comparison to the estimated values.

24. A method for the nondestructive testing of a sheet of dielectric material having opposite faces conductively surfaced and edges of exposed dielectric, comprising:
(a) determining, by means of injected microwave energy passed through the dielectric sheet, respective values related to the average dielectric constant of the sheet along a plurality of paths in the plane of the sheet, said paths comprising a first group of mutually parallel paths and a second group of mutually parallel paths oriented to intersect the paths of the first group;
(b) estimating, for each area of the sheet consisting of the intersection of a path selected from the first group and a path selected from the second group, a value related to the mean dielectric constant for said area, the estimating step comprising:
 (i) assigning an estimated value to each area;
 (ii) for each path in succession, adjusting the estimated values for the areas making up that path by an amount proportional to the difference between the average estimated value for areas making up that path and the value determined along that path; and
 (iii) repeating step (ii) one or more times until the amounts of the adjustments become insignificant in comparison to the estimated values.

25. The method of claim 24, wherein in step (b) (ii), all adjustments for paths in the first group are made prior to the adjustment of any path in the second group.

* * * * *

UNITED STATES PATENT AND TRADEMARK OFFICE
CERTIFICATE OF CORRECTION

PATENT NO. : 4,581,574

DATED : April 8, 1986

INVENTOR(S) : Sperry H. Goodman et al.

It is certified that error appears in the above-identified patent and that said Letters Patent is hereby corrected as shown below:

Column 1, line 47, "depole" should be --dipole--

Column 3, line 44, "as" should be --has--

Column 7, line 18, "bi-directional" should be --bidirectional--

Column 7, line 61, "tha" should be --that--

Column 11, line 14, Insert --source-- after "signal"
(Claim 6, line 20 - 2nd occurrence)

Column 12, line 23, "connectd" should be --connected--
(Claim 14, line 29)

Signed and Sealed this

Twenty-ninth Day of July 1986

[SEAL]

Attest:

Attesting Officer

DONALD J. QUIGG

Commissioner of Patents and Trademarks